United States Patent [19]

Fukano

[11] Patent Number: 4,465,532
[45] Date of Patent: Aug. 14, 1984

[54] METHOD FOR FORMING AN ISOLATION REGION FOR ELECTRICALLY ISOLATING ELEMENTS

[75] Inventor: Tetsu Fukano, Kanagawa, Japan

[73] Assignee: Fujitsu Limited, Kawasaki, Japan

[21] Appl. No.: 549,470

[22] Filed: Nov. 7, 1983

[30] Foreign Application Priority Data

Nov. 29, 1982 [JP] Japan .................................. 57-209172
Nov. 29, 1982 [JP] Japan .................................. 57-209173

[51] Int. Cl.³ ........................ C23F 1/02; C03C 15/00; B44C 1/22; H01L 21/306
[52] U.S. Cl. .................................... 156/643; 148/187; 156/646; 156/647; 156/652; 156/653; 156/657; 156/656; 156/659.1; 156/662; 204/192 E; 252/79.1; 427/93; 29/576 W; 29/580
[58] Field of Search ............... 156/643, 646, 647, 652, 156/653, 657, 659.1, 656, 661.1, 662, 664, 345; 29/580, 576 W; 252/79.1; 427/38, 39, 93; 204/192 EC, 192 E, 298; 430/313, 316, 317, 318; 148/1.5, 187

[56] References Cited

U.S. PATENT DOCUMENTS 4,369,565  1/1983  Muramatsu ......................... 29/580
4,373,990  2/1983  Porter ................................ 156/643

*Primary Examiner*—William A. Powell
*Attorney, Agent, or Firm*—Staas & Halsey

[57] ABSTRACT

A method for forming an isolation region having a submicron width thereof in a semiconductor substrate includes the steps of forming a metal or a metal silicide layer on the semiconductor substrate then forming a resist layer on the metal or metal silicide layer and patterning the resist layer. The method includes selectively etching the metal or metal silicide layer and the semiconductor substrate by the reactive ion etching process using a mixture of chlorine-containing gas and oxygen gas to form a groove in the surface portion of the semiconductor substrate located around the edge of the resist layer and forming an insulating layer in the groove.

22 Claims, 23 Drawing Figures

4,465,532

METHOD FOR FORMING AN ISOLATION REGION FOR ELECTRICALLY ISOLATING ELEMENTS

BACKGROUND OF THE INVENTION (1) Field of the Invention

The present invention relates to a method for forming an isolation region for electrically isolating elements, more particularly, to a method for forming an isolation region by which a semiconductor device having a high integration density can be produced.

(2) Description of the Prior Art

It is well known that an isolation region, i.e., a region for isolating elements from each other, is formed by the steps of forming a silicon nitride ($Si_3N_4$) layer on a silicon substrate, patterning the silicon nitride, and then forming a silicon dioxide layer by thermal oxidation of the surface of the silicon substrate using the patterned silicon nitride layer as a masking film.

In the above-mentioned steps, however, particularly in the thermal oxidation of the surface of the silicon substrate, the silicon layer located below the edge portion of the silicon nitride layer is simultaneously oxidized. The resultant silicon dioxide layer raises the edge portion of the silicon nitride layer. This silicon dioxide layer, commonly called a "bird's beak" due to its configuration, extends to the active region and therefore has a detrimental effect on the integration density.

In an improved method for forming an isolation region, grooves are formed in the surface portion of the silicon substrate by using a photolithography technique. Thermal oxidation or a chemical vapor deposition (CVD) process is then used to form an insulating layer on the grooves, thereby effecting element isolation. The smallest possible width of the grooves formed in the surface of the silicon substrate, namely, the width of the isolation region, is presently only 1 $\mu$m due to limitations of the photolithography process. It has not been possible up until now to form submicron-width isolation regions.

SUMMARY OF THE INVENTION

It is therefore an object of the present invention to provide a method for forming an isolation region having a submicron width.

It is a further object of the present invention to provide a method for forming an isolation region without employing a fine photolithography process.

It is still a further object of the present invention to provide a method for forming an isolation region which can be used in a semiconductor device, such as a bipolar transistor or a metal oxide semiconductor (MOS) transistor, having a high integration density.

According to the present invention, there is provided a method for forming an isolation region for electrically isolating elements in a semiconductor substrate, which includes the steps of: forming a metal or a metal silicide layer on the semiconductor substrate; forming a resist layer on the metal or metal silicide layer; patterning the resist layer; selectively etching the metal or metal silicide layer and the semiconductor substrate by a reactive ion etching process using a mixture of chlorine-containing gas and oxygen gas to form a groove in the surface portion of the semiconductor substrate around the periphery of the resist layer; and forming an insulating layer in the groove.

Further, according to the present invention there is provided a method for forming an isolation region for electrically isolating elements in a semiconductor substrate, which includes the steps of: forming in turn, a first insulating layer, a metal or a metal silicide layer, and resist layer; patterning the resist layer; selectively etching the metal or metal silicide layer by the reactive ion etching process using a mixture of chlorine-containing gas and oxygen gas; etching the first insulating layer using the metal or metal silicide layer as a masking film; etching the semiconductor substrate using the patterned first insulating layer as a masking film to form a groove in the surface portion of the semiconductor substrate; and forming a second insulating layer in the groove.

BRIEF DESCRIPTION OF THE DRAWINGS

The present invention will now be explained in detail with reference to the accompanying drawings, wherein.

DESCRIPTION OF THE PREFERRED EMBODIMENTS

According to the present invention, there is provided a method for forming an isolation region for electrically isolating elements in a semiconductor substrate, comprising the steps of: forming a metal or a metal silicide layer on the semiconductor substrate; forming a resist layer on the metal or metal silicide layer; patterning the resist layer; selectively etching the metal or metal silicide layer and the semiconductor substrate by a reactive ion etching process which uses a mixture of chlorine-containing gas and oxygen gas to form a groove in the surface portion of the semiconductor substrate around the edge of the resist layer; and forming an insulating layer in the groove.

It is preferable that the metal be selected from the group consisting of molybdenum tungsten, titanium, platinum, and tantalum, that the metal silicide be selected from the group consisting of molybdenum silicide, tungsten silicide, titanium silicide, platinum silicide, and tantalum silicide, and that the chlorine-containing gas be selected from the group consisting of carbon tetrachloride. The reactive ion etching is advantageously carried out by using a mixed gas of oxygen and carbon tetrachloride at a power density of 0.14 to 0.35 W/cm$^2$ and in a vacuum having a pressure of 1 to 10 Pa, for 1 to 9 minutes. The volume percentage of oxygen in the mixed gas of oxygen and carbon tetrachloride being 60% to 70%.

The insulating layer in the groove is preferably formed by a thermal oxidation process at a temperature of 800° C. to 1100° C. under a wet oxidation atmosphere and by a CVD process and, further, by oxidizing the whole inner wall of the groove by a thermal oxidation process and burying the groove in polycrystalline silicon by the CVD process.

FIGS. 1A to 1D are schematic cross-sectional views for explaining the steps of the method according to a first embodiment of the present invention.

Figure 1A:
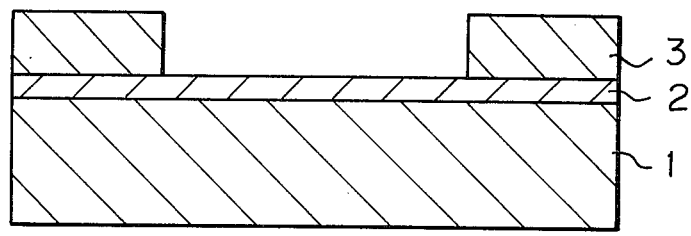
FIGS. 1A to 1D are schematic cross-sectional views of a device used to explain the method steps according to the present invention.

As shown in FIG. 1A, a molybdenum silicide (MoSi$_2$) layer 2, about 0.3 μm thick, is formed on a silicon substrate 1 by a D.C. magnetron sputtering process. A resist layer 3, for example, resist AZ-1350J manufactured by SHIPLEY Co., is formed on the molybdenum silicide layer 2 at a thickness of approximately 1.8 μm by the well-known spinning process. The resist layer 3 is then patterned to obtain a desired pattern form.

Figure 1B:
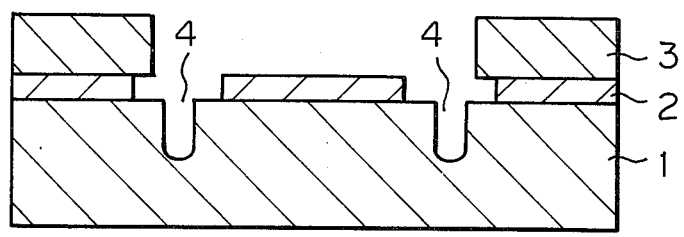

As shown in FIG. 1B, the molybdenum silicide layer 2 and the silicon substrate 1 are etched by the reactive ion etching process. The reactive ion etching process is carried out by using a mixed gas of 70% oxygen and 30% carbon tetrachloride, at a power density of 0.28 W/cm$^2$, in a vacuum having a pressure of 4 Pa, and at an etching time of 9 minutes. In the etching process, the molybdenum silicide layer 2 located around the edge of the resist layer 3 is first etched and then the surface of the silicon substrate 1, located around the periphery of the resist layer 3, is etched so as to form grooves 4 having a width of 0.3 μm and a depth of 0.8 μm. It is noted that peripheral etching is carried out so that the periphery of the resist is positioned at the desired pattern.

Figure 1C:
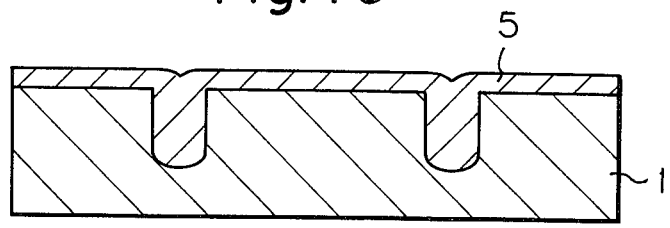

As shown in FIG. 1C, the resist layer 3 and the molybdenum silicide layer 2 are then removed by an oxygen plasma washing and a wet etching process, respectively.

Thermal oxidation is then effected at a temperature of 1000° C. under a wet oxygen atmosphere to form a silicon dioxide (SiO$_2$) layer 5 having a thickness of approximately 0.3 μm over the silicon substrate 1, the thickness is the same level as the width of the grooves 4. The width of the silicon dioxide layer formed in the grooves is approximately 0.6 μm, twice the width of the grooves.

Figure 1D:
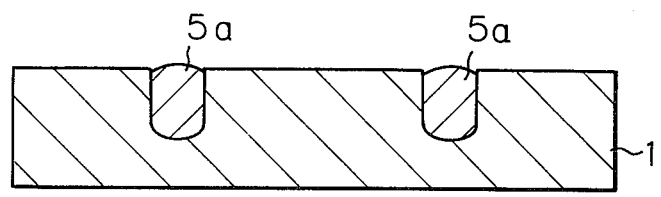

As shown in FIG. 1D, the silicon dioxide layer 5, formed over the top surface of silicon substrate 1, is removed by a normal wet etching process, leaving the silicon dioxide in the grooves 4 as buried silicon dioxide regions 5a. The surfaces of the buried silicon dioxide regions 5a are substantially flat. The silicon dioxide regions 5a act as isolation regions for a variety of semiconductor devices.

According to the present invention, there is further provided a second embodiment for a method for forming an isolation region for electrically isolating elements in a semiconductor substrate, comprising the steps of: forming a first insulating layer, a metal or a metal silicide layer, and a resist layer; patterning the resist layer; selectively etching the metal or metal silicide layer by the reactive ion etching process using a mixture of chlorine-containing gas and oxygen gas. The method further includes etching the insulating layer using the metal or metal silicide layer as a masking film; etching the semiconductor substrate using the patterned insulating layer as a masking film to form a groove in the surface portion of the semiconductor substrate; and forming a second insulating layer in the groove.

The same preferable constituents and conditions as in the first method apply to the second method. Further, the etching of the first insulating layer to form the groove is advantageously carried out by a reactive ion etching process using an etching gas of trifluoromethane at a power density of 0.06 to 0.8 W/cm$^2$ and in a vacuum having a pressure of 0.9 to 13 Pa, for 3 to 30 minutes. Then, the subsequent etching of the semiconductor substrate to form the groove is advantageously carried out by a reactive ion etching process using a mixed gas of 20 volume % oxygen and 80% carbon tetrachloride at a power of density 0.28 W/cm$^2$, in a vacuum having a pressure of 4 Pa and an etching time of 5 minutes.

FIGS. 2A to 2F are schematic cross-sectional views for explaining the steps of the method according to a second embodiment of the present invention.

Figure 2A:
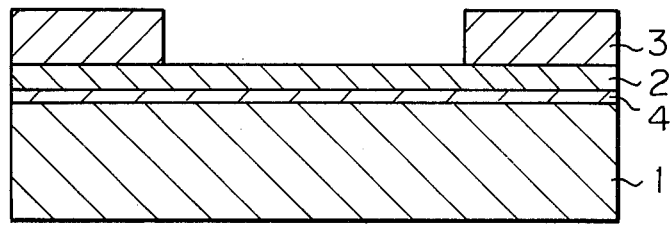
FIGS. 2A to 2F are schematic cross-sectional views of another example used to explain the method steps according to the present invention.

As shown in FIG. 2A, an insulating layer 4, about 0.1 μm thick and consisting of, for example, silicon nitride (Si$_3$N$_4$), is formed on a silicon substrate 1 by the CVD process. Then, a metal silicide layer 2, about 0.3 μm thick and consisting of, for example, molybdenum silicide, is formed on the insulating layer 4 by the D.C. magnetron sputtering process. A resist layer 3, for example, resist AZ-1350J manufactured by SHIPLEY Co., is formed on the metal silicide layer 2 at a thickness of approximately 1.8 μm by a well known spinning process. The resist layer 2 is then patterned to obtain a required form.

Figure 2B:
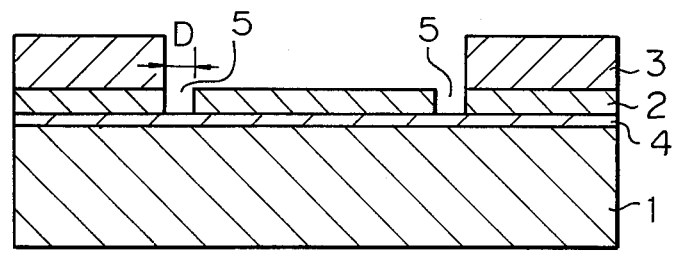

As shown in FIG. 2B, the metal silicide layer 2, located around the periphery of the resist layer 3 is then etched by the reactive ion etching process to form grooves 5. The reactive ion etching process is carried out at the same etching conditions as in FIG. 1B. The obtained grooves 5 have a width D of 0.2 to 0.3 μm.

Figure 2C:
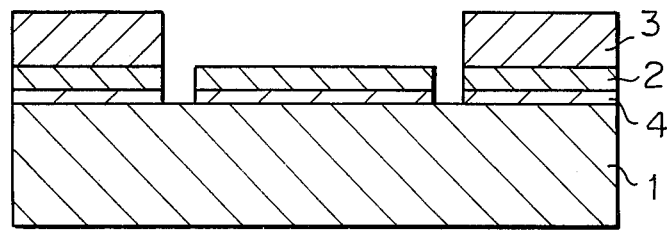

As shown in FIG. 2C, the etching gas in the parallel-plate-type reactive ion etching apparatus is then changed to trifluoromethane (CHF$_3$), and the exposed insulating layer 4 is etched by the reactive ion etching process under a power density of 0.16 W/cm$^2$, in a vacuum having a pressure of 6.7 Pa, and an etching time of 15 minutes, using the patterned metal silicide layer 2 and the resist layer 3 as a mask.

Figure 2D:
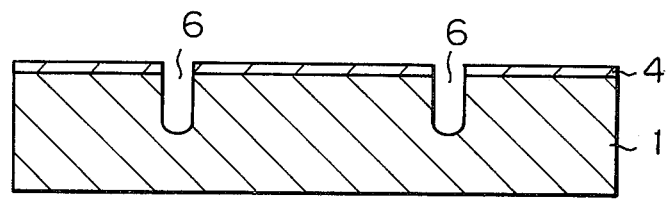

As shown in FIG. 2D, the resist layer 3 is then removed by a washing process, the etching gas in the parallel-plate-type reactive ion etching apparatus is changed to a gas which will etch the metal silicide layer 2 and the silicon substrate 1 but not easily etch the insulating layer 4, i.e., a mixed gas of 20 volume % oxygen and 80% carbon tetrachloride, the etching conducted at a power density of 0.28 W/cm$^2$, a degree of vacuum of 4 Pa, and an etching time of 5 minutes. As a result the metal silicide layer 2 is removed and grooves 6 having a width of approximately 0.2 to 0.3 μm are formed in the silicon substrate 1 to a depth of approximately 0.7 μm.

Figure 2E:
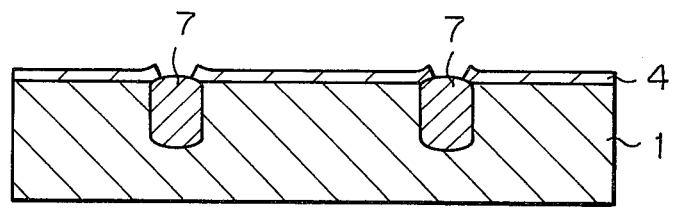

As shown in FIG. 2E, thermal oxidation is then effected at a temperature of 1000° C. under a wet oxidizing atmosphere to form an insulating layer 7 consisting of silicon dioxide, which acts as an isolation region. The width of the silicon dioxide layer formed in the groove is approximately 0.4 to 0.6 μm, twice the width of the grooves 6.

Figure 2F:
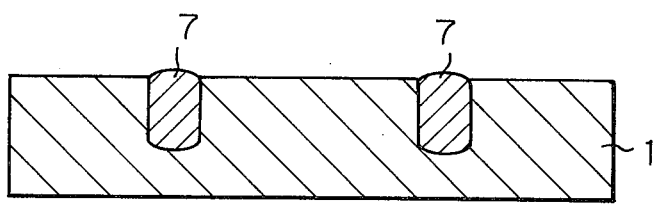

Subsequently, as shown in FIG. 2F, the insulating layer 4 at the surface is removed by a wet etching process using phosphoric acid at 180° C. to leave isolation regions having submicron widths in the grooves.

Figure 3:
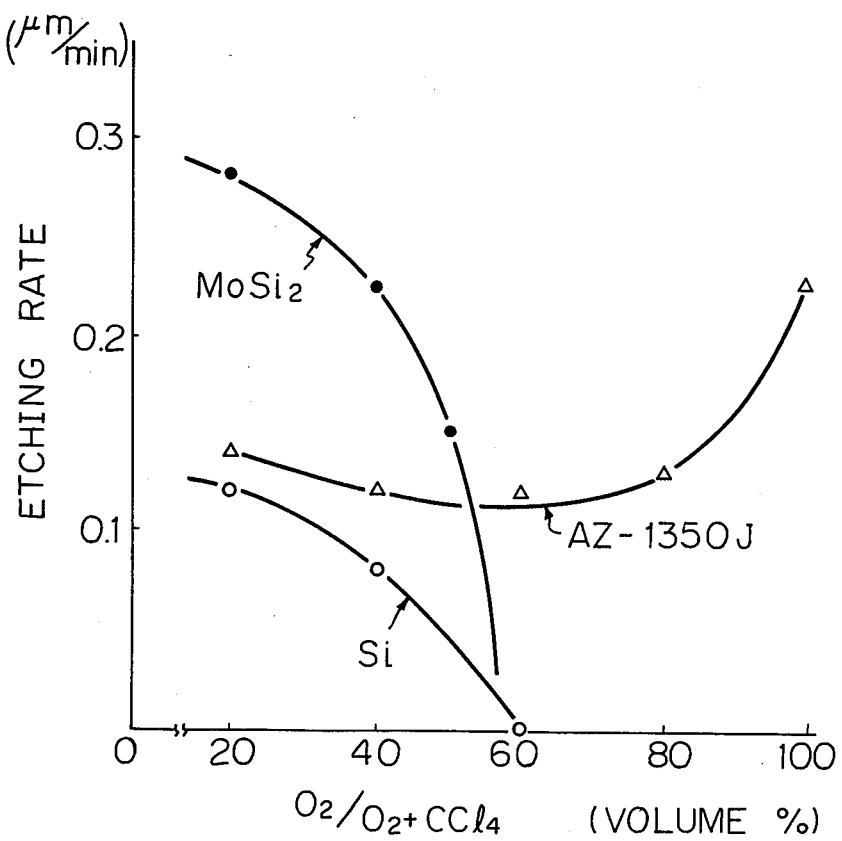
FIG. 3 is a graph of the relationship between the percent of oxygen in the gas and the etching rate.

According to the present invention, in order to obtain grooves with submicron widths in the silicon substrate 1 located around the periphery of the resist layer 3 by the reactive ion etching process using a mixed gas of oxygen and carbon tetrachloride under the conditions of FIGS. 1A to 1D, the volume percentage of the oxygen in the mixed gas of the oxygen and the carbon tetrachloride is preferably from 60% to 70% as stated before. FIG. 3 shows the relationship between the oxygen volume percentage in the mixed gas and the etching rate obtained by using a parallel-plate-type reactive ion etching device under the etching conditions mentioned above. The metal silicide and resist used were the same as in FIG. 1A, i.e., molybdenum silicide and resist AZ-1350J manufactured by SHIPLEY Co. As can be seen from FIG. 3, when the volume percentage of the oxygen in the mixed gas is less than 50%, the molybdenum silicide layer and the silicon substrate not covered by resist can be etched. On the other hand, when the volume percentage of the oxygen in the mixed gas is 80% or more, merely washing the resist is carried out and the molybdenum silicide layer and silicon substrate are not etched. It is understood that the reason why the molybdenum silicide layer and the silicon substrate are not etched is that a large quantity of oxygen forms an oxide layer over the surface of the molybdenum silicide layer. It is believed that the phenomenon of etching only the molybdenum silicide layer and the silicon substrate around the periphery of the resist layer, when reactive ion etching is carried out using a volume percentage of oxygen in the mixed gas of from 60% to 70%, is due to the fact that a large amount of oxygen in the mixed gas is used for oxidation of the surface of the molybdenum silicide and the washing of the resist layer. When the volume percentage of the oxygen around the edge of the resist layer becomes less than 50%, the molybdenum silicide layer under the oxygen is etched, and then the silicon substrate is etched.

Figure 4:
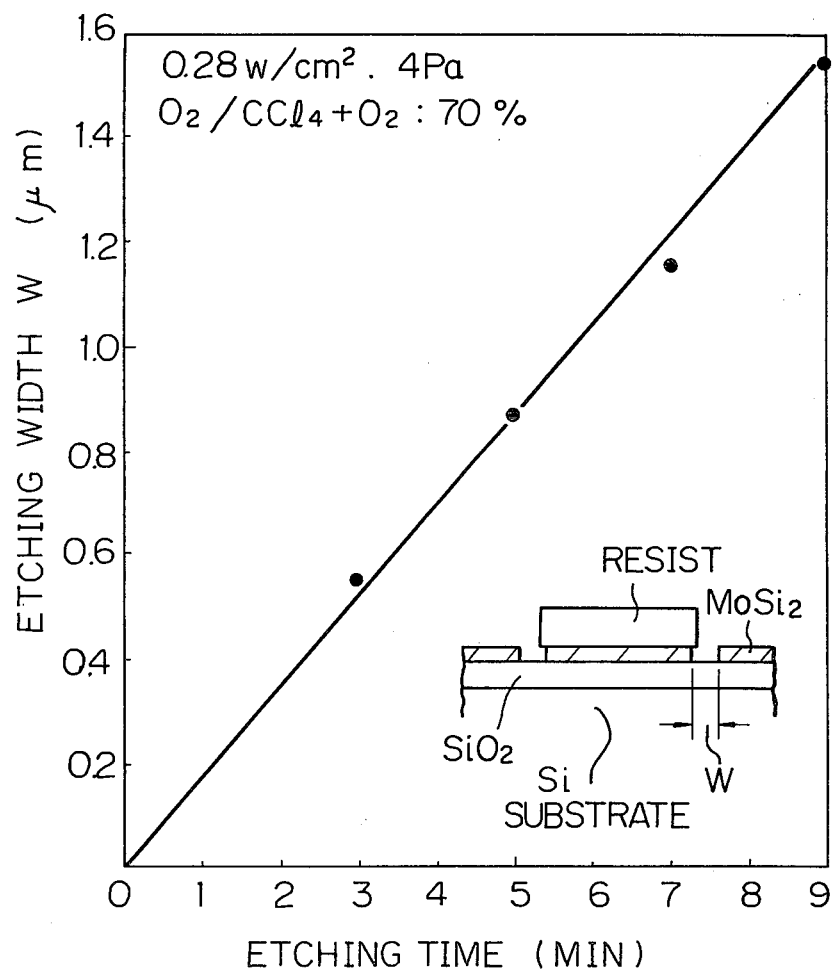
FIG. 4 is a graph of the relationship between the etching time and the etching width.

FIG. 4 is the relationship between the etching time and etching width at an oxygen volume of 70% in the mixed gas of oxygen and carbon tetrachloride, a power density of 0.28 W/cm$^2$, and in a vacuum having a pressure of 4 Pa. This graph shows that a submicron width groove can be obtained in the silicon substrate within five minutes.

FIGS. 5, 6 and 7A to 7C are schematic cross-sectional views of alternative processes for forming isolation regions in the grooves of the substrate.

Figure 5:
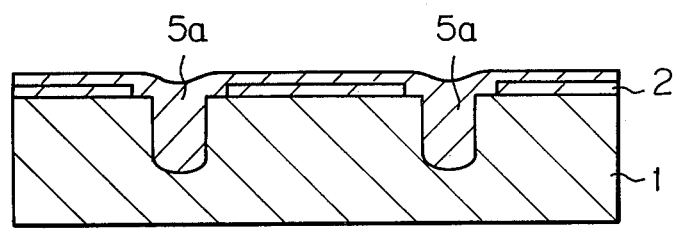
FIG. 5 is a schematic cross-sectional view used to explain the method steps of an alternative method for forming an isolation region in a groove according to the present invention.

As shown in FIG. 5, after the step of FIG. 1B, only the resist layer 3 is removed. The molybdenum silicide layer 2 is left as it is. Then, a thermal oxidation process is performed under the same conditions as in the step of FIG. 1C. The silicon dioxide layer and the molybdenum silicide layer 2 over the silicon substrate 1 are removed, leaving the silicon dioxide in the grooves 4 as the buried silicon dioxide regions 5a. Note, in this process, the molybdenum silicide layer 2 is slightly oxidized, thereby decreasing in thickness.

Figure 6:
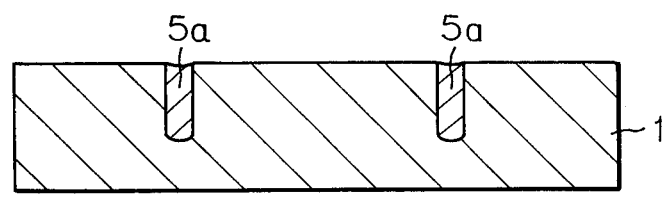
FIG. 6 is a schematic cross-sectional view used to explain the method steps of another alternative method for forming an isolation region in a groove according to the present invention.

Referring to FIG. 6, after removing the resist layer 3 and the molybdenum silicide layer 2 as in FIG. 1B or after removing the insulating layer 4 from the substrate of FIG. 2D, silicon dioxide is deposited in the grooves and on the surface of the silicon substrate 1 by the CVD process. Then, the silicon dioxide layer on the surface of the silicon substrate 1 is removed to form the isolation regions 5a having a width of the grooves 4, i.e., 0.3 μm.

Figure 7A:
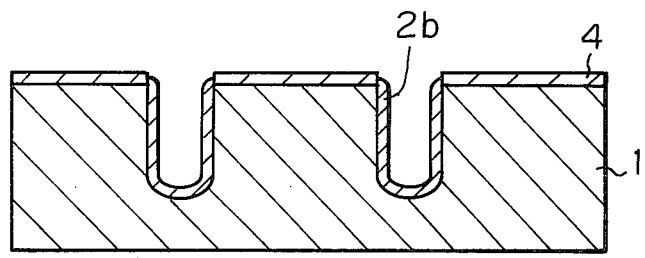
FIGS. 7A to 7C are schematic cross-sectional views used to explain the method steps of another alternative method for forming an isolation region in a groove according to the present invention.
Figure 7B:
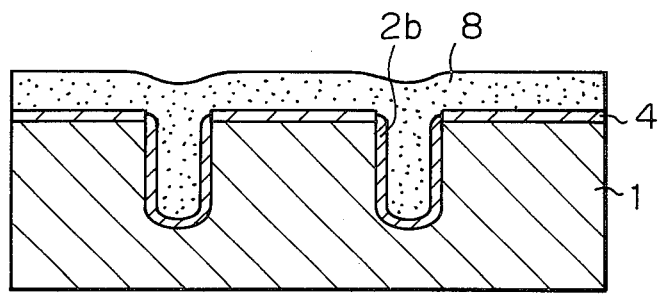
Figure 7C:
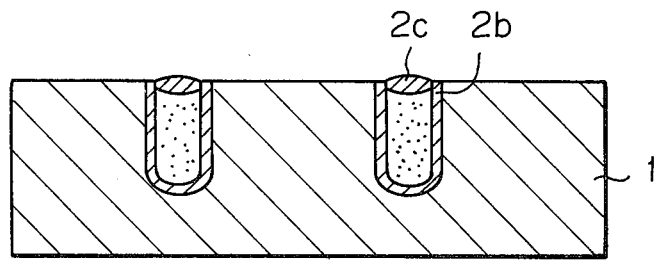

Referring to FIGS. 7A to 7C, after removing the resist layer 3 and the molybdenum silicide layer 2 as in FIG. 1B or the step of FIG. 2D, as shown in FIG. 7A, the inner wall of the grooves in the silicon substrate 1 is slightly oxidized by a thermal oxidation process to form a silicon dioxide layer 2b.

As shown in FIG. 7B, a polycrystalline silicon layer 8 is then deposited over the silicon substrate by a well known low pressure CVD process to bury the grooves.

As shown in FIG. 7C, the deposited polycrystalline silicon layer 8 is removed by polishing to provide a flat surface using the silicon nitride 4 as a mask. Alternatively, anisotropic dry etching may be used to provide the flat surface. Subsequently, the exposed polycrystalline silicon above the grooves is oxidized by the thermal oxidation process to make a silicon dioxide layer 2C having a thickness of 0.3 μm. Then, the silicon insulating layer 4, such as silicon nitride, is removed. Thus, the isolation region can be produced.

Figure 8:
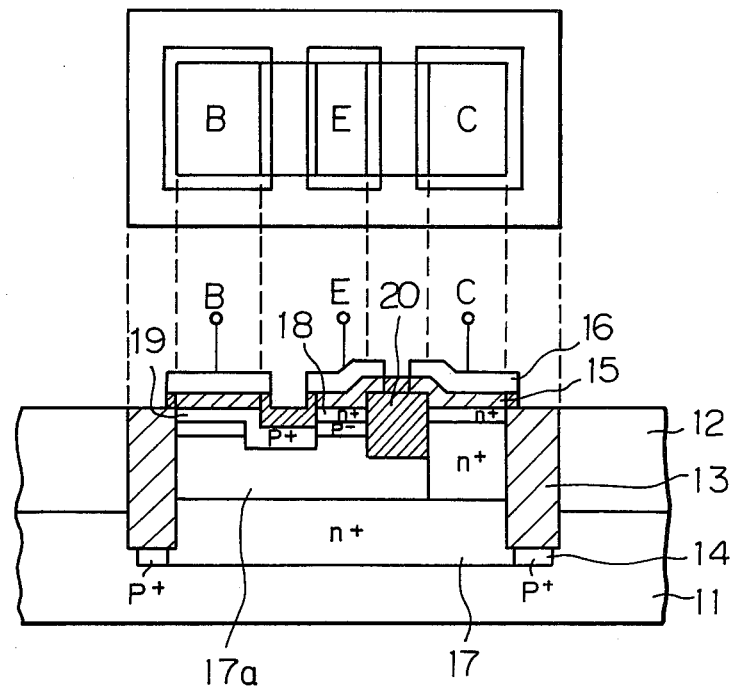
FIG. 8 is a schematic cross-sectional view and top view, applying the present invention to a bipolar transistor.
Figure 9:
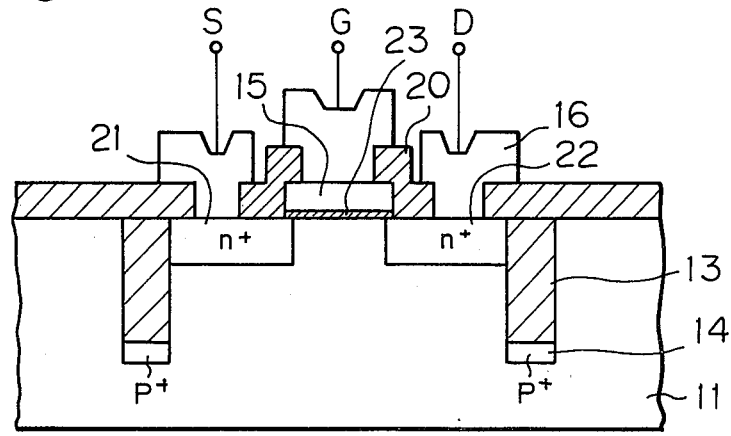
FIG. 9 is a schematic cross-sectional view, applying the present invention to an n type MOS transistor.

The isolation region obtained by the present invention can be applied to, for example, a bipolar transistor or MOS transistor. FIGS. 8 and 9 are schematic views of embodiments of the present invention as applied to a bipolar transistor and an NMOS transistor, respectively.

In FIGS. 8 and 9, reference numeral 11 denotes p type silicon substrate, 12 n type epitaxial silicon layer, 13 an isolation region, 14 a channel stopper region, 15 polycrystalline silicon, 16 aluminum, 17 an n$^+$ buried layer, 17a n type collector region, 18 an n$^+$ region (emitter), 19 a p$^+$ region (base), 20 an insulating layer, 21 a source region, 22 a drain region, and 23 a gate insulating layer. B, E, and C denote a base, emitter, and collector, and S, D, and G denote a source, drain, and gate, respectively.

The devices shown in FIGS. 8 and 9 have a high integration density since the width of the isolation region 13 is submicron.

FIGS. 10A to 10D are views of further application of the present invention to CMOS transistors.

Figure 10A:
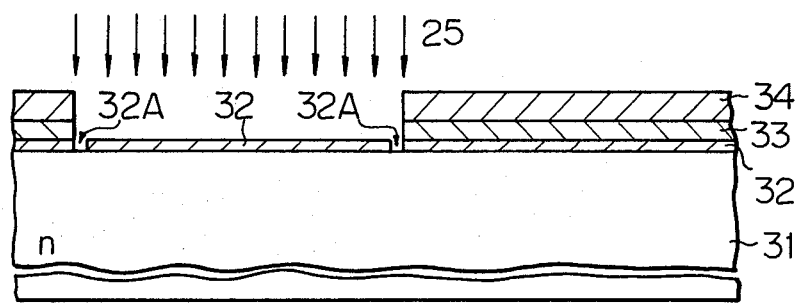
FIGS. 10A to 10D are schematic cross-sectional views, applying the present invention to a complementary MOS (CMOS) transistor.

In FIG. 10A, substantially the same device as shown in FIG. 2B is illustrated.

Reference numeral 31 denotes an n type semiconductor substrate, 32 silicon nitride layer, 33 molybdenum silicide, 34 a resist layer, and 32A grooves having a submicron width. Boron ions 25 are implanted, and an annealing is carried out to form a P type well 21a.

Figure 10B:
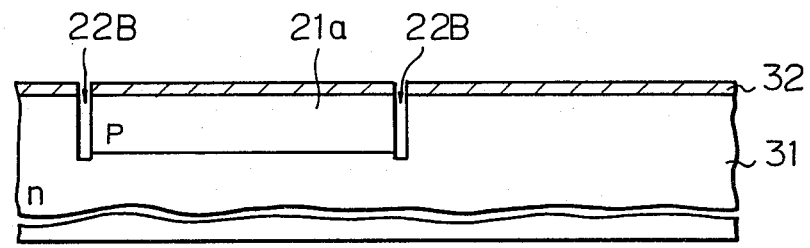

As shown in FIG. 10B, the grooves 32A are further etched by using the nitride layer 32 as an etching mask. In this etching, the molybdenum silicide may be removed in advance.

Figure 10C:
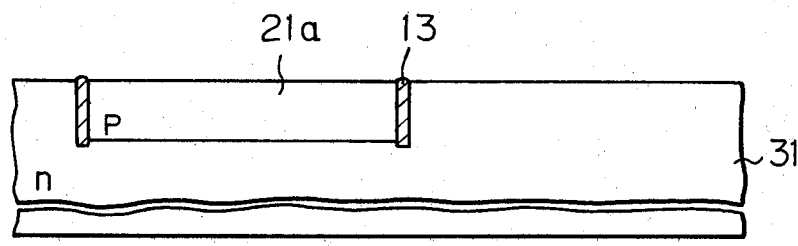
Figure 10D:
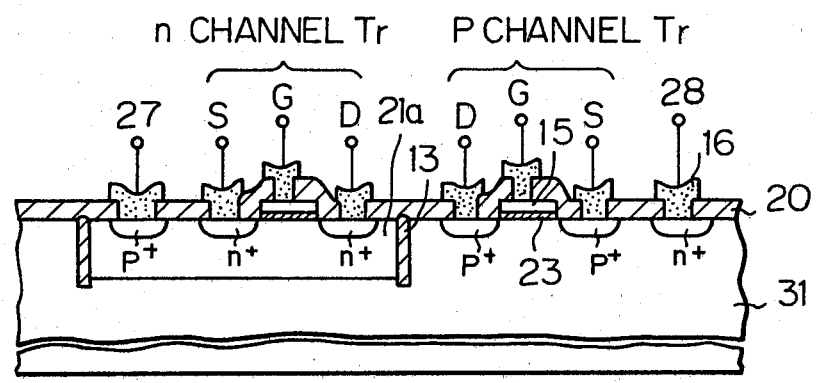

As shown in FIG. 10C, a buried insulating layer 13 is formed in the grooves 22B so that the insulating layer can be self-aligned around the p-well 21a. Subsequently, as shown in FIG. 10D, a p channel transistor and an n channel transistor are formed by well known technology. In FIG. 10D, reference numerals 27 and 28 denote a p well contact and an n type substrate contact, respectively.

I claim:

1. A method for forming an isolation region for electrically isolating elements in a semiconductor substrate, comprising the steps of:
- (a) forming a metal layer on the semiconductor substrate;
- (b) forming a resist layer on the metal layer;
- (c) patterning the resist layer;
- (d) selectively etching the metal and the semiconductor substrate by a reactive ion etching process using a mixture of chlorine-containing gas and oxygen gas to form a groove in the surface portion of the semiconductor substrate located around the periphery of the resist layer; and
- (e) forming an insulating layer in the groove.

2. A method according to claim 1, wherein said step (a) comprises selecting the metal selected from the group consisting of molybdenum, tungsten, titanium, platinum and tantalum.

3. A method according to claim 1, wherein said step (a) comprises selecting the metal silicide from the group consisting of molybdenum silicide, tungsten silicide, titanium silicide, platinum silicide and tantalum silicide.

4. A method according to claim 1, wherein said step (d) comprises selectively etching the metal layer using a chlorine-containing gas selected from the group of carbon tetrachloride, silicon tetrachloride and boron trichloride.

5. A method according to claim 4, wherein said step (d) comprises reactive ion etching by using a mixed gas of oxygen and carbon tetrachloride at a power density of 0.14 to 0.35 W/cm$^2$ and in a vacuum having a pressure of 1 to 10 Pa, for 3 to 30 minutes, the volume percentage of oxygen in the mixed gas of oxygen and carbon tetrachloride being 60% to 70%.

6. A method according to claim 1, wherein said step (e) comprises forming the insulating layer in the groove by a thermal oxidation process at a temperature of 800° C. to 1100° C. under a wet oxidation atmosphere.

7. A method according to claim 1, wherein said step (e) comprises forming the insulating layer in the groove by a chemical vapor deposition process.

8. A method according to claim 1, wherein said step (e) of forming the insulating layer in the groove comprises the substeps of:
- (i) oxidizing the whole inner wall of the groove by a first thermal oxidation process;
- (ii) burying the groove in polycrystalline silicon by a chemical vapor deposition process; and
- (iii) oxidizing the exposed surface of polycrystalline silicon in the groove by a second thermal oxidation process.

9. A method for forming an isolation region for electrically isolating elements in a semiconductor substrate having a surface portion, comprising the steps of:
- (a) forming a first insulating layer;
- (b) forming a metal layer on the first insulating layer;
- (c) forming a resist layer on the metal layer;
- (d) patterning the resist layer;
- (e) selectively etching the metal layer by a reactive ion etching process using a mixture of chlorine-containing gas and oxygen gas;
- (f) etching the first insulating layer using the metal layer as a masking film;
- (g) etching the semiconductor substrate using the etched insulating layer as a masking film to form a groove in the surface portion of the semiconductor substrate; and
- (h) forming a second insulating layer in the groove.

10. A method according to claim 9, wherein said step (a) comprises selecting the first insulating layer from the group consisting of silicon nitride and silicon dioxide.

11. A method according to claim 9, wherein said step (b) comprises selecting the metal from the group consisting of molybdenum, tungsten, titanium, platinum, and tantalum.

12. A method according to claim 1, wherein said step (b) comprises selecting the metal silicide from the group consisting of molybdenum silicide, tungsten silicide, titanium silicide, platinum silicide, and tantalum silicide.

13. A method according to claim 9, wherein said step (e) comprises selecting the chlorine-containing gas from the group consisting of carbon tetrachloride, silicon tetrachloride and boron trichloride.

14. A method according to claim 9, wherein said step (e) comprises reactive ion etching using a mixed gas of oxygen and carbon tetrachloride at a power density of 0.14 to 0.35 W/cm$^2$ and in a vacuum having a pressure of 1 to 10 Pa, for 1 to 9 minutes, the volume percentage of oxygen in the mixed gas of oxygen and carbon tetrachloride being 60% to 70%.

15. A method according to claim 9, wherein said step (f) comprises etching the first insulating layer by a reactive ion etching process using an etching gas of trifluoromethane at a power density of 0.06 to 0.8 W/cm$^2$ and in a vacuum having a pressure of 0.9 to 13 Pa, for 3 to 30 minutes.

16. A method according to claim 9, wherein said step (g) comprises etching the semiconductor substrate by a reactive ion etching process using a mixed gas of oxygen and carbon tetrachloride at a power of 0.14 to 0.35 W/cm$^2$ and in a vacuum having a pressure of 1 to 10 Pa, for 3 to 30 minutes, the volume percentage of oxygen in the mixed gas of oxygen and carbon tetrachloride being less than 50%.

17. A method according to claim 9, wherein said step (f) comprises forming the insulating layer by a thermal oxidation process at a temperature of 800° C. to 1100° C. under a wet oxidation atmosphere.

18. A method according to claim 9, wherein said step (h) comprises forming the second insulating layer in the groove by a chemical vapor deposition process.

19. A method according to claim 9, wherein said step (f) comprises the substeps of:
- (i) oxidizing the whole inner wall of the groove by a first thermal oxidation process:
- (ii) burying the groove in polycrystalline silicon by the chemical vapor deposition process; and
- (iii) oxidizing the exposed surface of the groove by a second thermal oxidation process.

20. A method for forming an isolation region for electrically isolating elements in a semiconductor substrate, comprising the steps of:
- (a) forming a metal silicide layer on the semiconductor substrate;
- (b) forming a resist layer on the metal silicide layer;
- (c) patterning the resist layer;
- (d) selectively etching the metal silicide layer and the semiconductor substrate by a reactive ion etching process using a mixture of chlorine-containing gas and oxygen gas to form a groove in the surface portion of the semiconductor substrate surrounding the periphery of the resist layer; and
- (e) forming an insulating layer in the groove.

21. A method for forming an isolation region for electrically isolating elements in a semiconductor substrate, comprising the steps of:

(a) forming a first insulating layer;
(b) forming a metal silicide layer on the first insulating layer;
(c) forming a resist layer on the metal silicide layer;
(d) patterning the resist layer;
(e) selectively etching the metal silicide layer by a reactive ion etching process using a mixture of chlorine-containing gas and oxygen gas;
(f) etching the first insulating layer using the metal silicide layer as a masking film;
(g) etching the semiconductor substrate using the etched insulating layer as a masking film to form a groove in the surface portion of the semiconductor substrate; and
(h) forming a second insulating layer in the groove.

22. A method according to claim 20, wherein said step (d) comprises selectively etching the metal silicide layer using a chlorine-containing gas selected from the group of carbon tetrachloride and boron trichloride.

* * * * *

UNITED STATES PATENT AND TRADEMARK OFFICE
CERTIFICATE OF CORRECTION

PATENT NO. : 4,465,532
DATED : AUGUST 14, 1984
INVENTOR(S) : TETSU FUKANO

It is certified that error appears in the above-identified patent and that said Letters Patent is hereby corrected as shown below:

```
Col. 3, line 46, "washing" should be --ashing--.

Col. 4, line 55, "washing" should be --ashing--;

Col. 5, line 30, "washing" should be --ashing--;
        line 43, "washing" should be --ashing--.

Col. 7, line 19, "1" should be --20--.

Col. 8, line 8, "1" should be --21--.
```

Signed and Sealed this

Ninth Day of April 1985

[SEAL]

*Attest:*

DONALD J. QUIGG

*Attesting Officer*  *Acting Commissioner of Patents and Trademarks*